United States Patent
Furukawa et al.

(10) Patent No.: US 12,543,576 B2
(45) Date of Patent: Feb. 3, 2026

(54) SEMICONDUCTOR DEVICE

(71) Applicant: DENSO CORPORATION, Kariya (JP)

(72) Inventors: Yasushi Furukawa, Kariya (JP); Hirohito Fujita, Kariya (JP); Tetsuto Yamagishi, Kariya (JP); Atsuya Akiba, Kariya (JP)

(73) Assignee: DENSO CORPORATION, Kariya (JP)

( * ) Notice: Subject to any disclaimer, the term of this patent is extended or adjusted under 35 U.S.C. 154(b) by 768 days.

(21) Appl. No.: 17/861,316

(22) Filed: Jul. 11, 2022

(65) Prior Publication Data
US 2023/0016437 A1 Jan. 19, 2023

(30) Foreign Application Priority Data

Jul. 16, 2021 (JP) .................. 2021-117976

(51) Int. Cl.
*H01L 23/00* (2006.01)
*H01L 23/31* (2006.01)
*H01L 23/495* (2006.01)

(52) U.S. Cl.
CPC .......... *H01L 24/05* (2013.01); *H01L 23/3135* (2013.01); *H01L 23/49568* (2013.01); (Continued)

(58) Field of Classification Search
CPC . H01L 2224/05541; H01L 2224/05551; H01L 2224/05553; H01L 2224/05573; H01L 2224/05655; H01L 2224/32245; H01L 2224/48245; H01L 2224/73215; H01L 2224/73265; H01L 2924/13091; H01L 2924/1811; H01L 2924/35121; H01L 2924/1815; H01L 2924/182;
(Continued)

(56) References Cited

U.S. PATENT DOCUMENTS 6,306,750 B1* 10/2001 Huang .................. H01L 24/05
438/597
2005/0006778 A1 1/2005 Shinyama et al.
(Continued)

FOREIGN PATENT DOCUMENTS

JP S56080151 A 7/1981
JP H01-039035 A 2/1989
(Continued)

*Primary Examiner* — Teresa M. Arroyo
(74) *Attorney, Agent, or Firm* — Posz Law Group, PLC

(57) ABSTRACT

In a semiconductor device, a first wiring member is electrically connected to a first main electrode on a first surface of a semiconductor element, and a second wiring member is electrically connected to a second main electrode on a second surface of the semiconductor element. An encapsulating body encapsulates at least a part of each of the first and second wiring members, the semiconductor element and a bonding wire. The semiconductor element has a protective film on the first surface of the semiconductor substrate, and the pad has an exposed surface exposed from an opening of the protective film. The exposed surface includes a connection area to which the bonding wire is connected, and a peripheral area on a periphery of the connection area. The peripheral area has a surface that defines an angle of 90 degrees or less relative to a surface of the connection area.

10 Claims, 6 Drawing Sheets

(52) U.S. Cl.
CPC .............. *H01L 24/32* (2013.01); *H01L 24/48* (2013.01); *H01L 24/73* (2013.01); *H01L 2224/05005* (2013.01); *H01L 2224/05013* (2013.01); *H01L 2224/05017* (2013.01); *H01L 2224/05082* (2013.01); *H01L 2224/05124* (2013.01); *H01L 2224/05541* (2013.01); *H01L 2224/05551* (2013.01); *H01L 2224/05553* (2013.01); *H01L 2224/05573* (2013.01); *H01L 2224/05655* (2013.01); *H01L 2224/32245* (2013.01); *H01L 2224/48245* (2013.01); *H01L 2224/73215* (2013.01); *H01L 2224/73265* (2013.01); *H01L 2924/13091* (2013.01); *H01L 2924/1811* (2013.01); *H01L 2924/1815* (2013.01); *H01L 2924/182* (2013.01); *H01L 2924/183* (2013.01); *H01L 2924/35121* (2013.01)

(58) Field of Classification Search
CPC ..... H01L 2924/183; H01L 2224/48247; H01L 23/051; H01L 23/3107; H01L 23/3142; H01L 23/3157; H01L 23/4334; H01L 23/3735; H01L 23/3135; H01L 23/49568; H01L 24/05; H01L 24/32; H01L 24/48; H01L 24/73; H01L 2224/05005; H01L 2224/05013; H01L 2224/05017; H01L 2224/05082; H01L 2224/05124; H01L 2924/181; H01L 2924/00012; H01L 2924/00014; H01L 2224/45099

See application file for complete search history.

(56) References Cited

U.S. PATENT DOCUMENTS

| | | | |
|---|---|---|---|
| 2010/0230787 A1 | 9/2010 | Guiraud et al. | |
| 2011/0049675 A1* | 3/2011 | Nagai | H10B 53/10 |
| | | | 257/532 |
| 2012/0273954 A1* | 11/2012 | Higgins, III | H01L 24/85 |
| | | | 257/762 |
| 2014/0284790 A1* | 9/2014 | Matsumoto | H01L 24/06 |
| | | | 257/737 |
| 2020/0251425 A1* | 8/2020 | Imoto | H01L 24/73 |
| 2021/0098346 A1* | 4/2021 | Okuyama | H01L 24/48 |
| 2022/0415771 A1* | 12/2022 | Hwang | H01L 23/49816 |

FOREIGN PATENT DOCUMENTS

| | | | | |
|---|---|---|---|---|
| JP | 03286541 | A * | 12/1991 | ............ H01L 24/05 |
| JP | H08-064632 | A | 3/1996 | |
| JP | 2004-111628 | A | 4/2004 | |
| JP | 2007-027183 | A | 2/2007 | |
| WO | WO-2020208990 | A1 * | 10/2020 | ......... H01L 23/3171 |

* cited by examiner

SEMICONDUCTOR DEVICE

CROSS REFERENCE TO RELATED APPLICATION

The present application claims the benefit of priority from Japanese Patent Application No. 2021-117976 filed on Jul. 16, 2021. The entire disclosures of the above application are incorporated herein by reference.

TECHNICAL FIELD

The present disclosure relates to a semiconductor device.

BACKGROUND

For example, JP 2007-27183 A discloses a semiconductor device including a semiconductor element. The semiconductor element has a first main electrode and a pad on one surface and a second main electrode on the other surface. The disclosure of JP 2007-27183 A is incorporated herein by reference as an explanation of technical elements in the present disclosure.

SUMMARY

The present disclosure provides a semiconductor device with high reliability. According to an aspect of the present disclosure, a semiconductor device includes a semiconductor element, a first wiring member, a second wiring member, a bonding wire, and an encapsulating body. The semiconductor element includes a semiconductor substrate having a first surface and a second surface opposite to the first surface in a thickness direction, a first main electrode disposed on the first surface of the semiconductor substrate, a second main electrode disposed on the second surface of the semiconductor substrate, and a pad, as a signal electrode, disposed on the first surface of the semiconductor substrate at a position different from the first main electrode. The first wiring member is electrically connected to the first main electrode. The second wiring member is electrically connected to the second main electrode. The bonding wire is connected to the pad. The encapsulating body encapsulates at least a part of the first wiring member, at least a part of the second wiring member, the semiconductor element and the bonding wire. The semiconductor element includes a protective film on the first surface, and the protective film is formed with an opening. The pad has an exposed surface exposed from the opening of the protective film. The exposed surface of the pad includes a connection area to which the bonding wire is connected.

DETAILED DESCRIPTION

Figure 1:
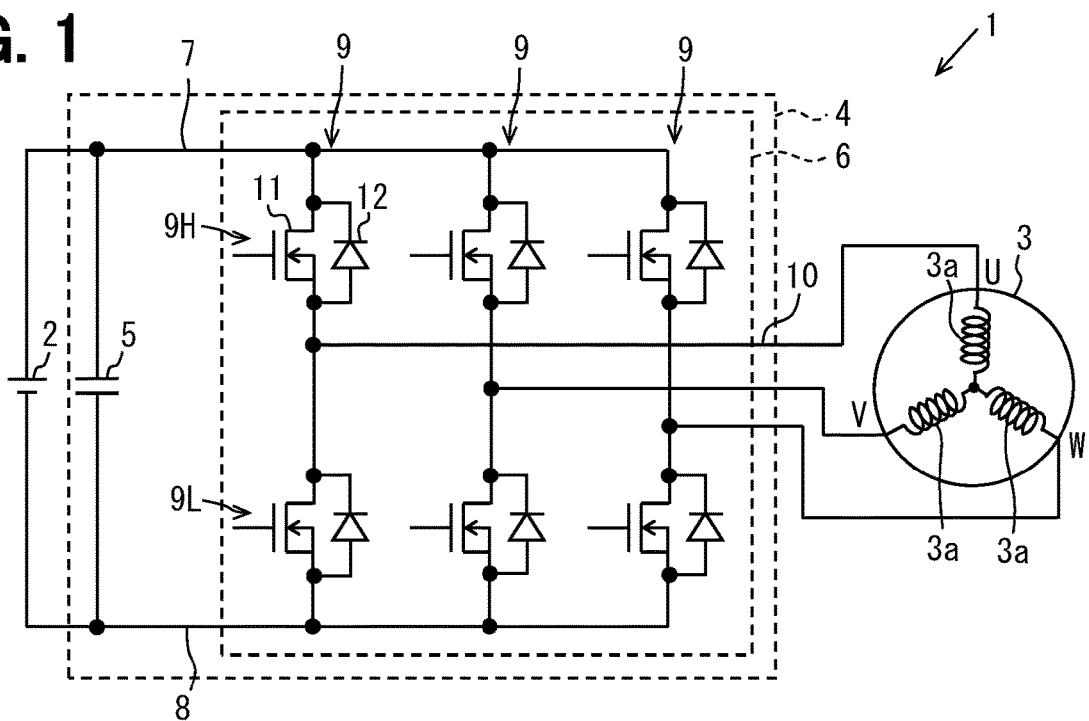
FIG. 1 is a diagram illustrating a schematic configuration of a vehicle drive system to which a semiconductor device according to a first embodiment is employed.

To begin with, a relevant technology will be described only for understanding the embodiments of the present disclosure.

For example, a semiconductor device has a semiconductor element, and the semiconductor element has a first main electrode and a pad on a first surface and a second main electrode on a second surface. A bonding wire is connected to a portion of the pad exposed from a protective film. The semiconductor element and the bonding wire are encapsulated by an encapsulating body.

In such a configuration, there is a possibility that peeling may occur at an interface between the encapsulating body and the protective film, for example, due to thermal stress caused by such as a power cycle or a cold heat cycle. If the peeling progresses to the connection portion between the pad and the bonding wire, the connection reliability will degrade. Further, a crack may occur at the connection portion between the pad and the bonding wire due to the thermal stress. Also, the encapsulating body may be peeled off, that is, separated due to the crack as a starting point. If the peeling progresses toward, for example, the main electrode provided on the same surface as the pad, the connection reliability of the main electrode will be degraded. If the peeling progresses to, for example, the end face of the semiconductor device, the insulation reliability will be degraded. From the above viewpoint or from other viewpoints not mentioned above, further improvement is required for the semiconductor device.

The present disclosure provides a semiconductor device with high reliability.

According to an aspect of the present disclosure, a semiconductor device includes a semiconductor element, a first wiring member, a second wiring member, a bonding wire, and an encapsulating body. The semiconductor element includes a semiconductor substrate having a first surface and a second surface opposite to the first surface in a thickness direction, a first main electrode disposed on the first surface of the semiconductor substrate, a second main electrode disposed on the second surface of the semiconductor substrate, and a pad, as a signal electrode, disposed on the first surface of the semiconductor substrate at a position different from the first main electrode. The first wiring member is electrically connected to the first main electrode. The second wiring member is electrically connected to the second main electrode. The bonding wire is connected to the pad. The encapsulating body encapsulates at least a part of the first wiring member, at least a part of the second wiring member, the semiconductor element and the bonding wire. The semiconductor element includes a protective film on the first surface, and the protective film is formed with an opening. The pad has an exposed surface exposed from the opening of the protective film. The exposed surface of the pad includes a connection area to which the bonding wire is connected, and a peripheral area on a periphery of the connection area. The peripheral area has a surface that defines a relative angle of 90 degrees or less relative to a surface of the connection area.

According to the semiconductor device described above, on the exposed surface of the pad, the relative angle defined between the surface of at least a part of the peripheral area and the surface of the connection area is 90 degrees or less. In such a configuration, on the exposed surface, it is less likely that the peeling of the encapsulating body will progress between the peripheral area and the connection area. As such, it is possible to provide the semiconductor device with high reliability.

Hereinafter, multiple embodiments of the present disclosure will be described with reference to the drawings. The same or corresponding elements are designated with the same reference numerals throughout the embodiments, and descriptions thereof will not be repeated. When only a part of a configuration is described in an embodiment, a configuration of another embodiment described earlier can be applied to the other parts of the configuration. Further, not only the combinations of the configurations explicitly shown in the description of the respective embodiments, but also the configurations of the multiple embodiments can be partially combined even when they are not explicitly shown as long as there is no difficulty in the combination in particular.

A semiconductor device of the present embodiment is applied to, for example, a power conversion device for a movable body having a rotary electric machine as a drive source. Examples of the movable body include a vehicle such as an electric vehicle (EV), a hybrid vehicle (HV), and a plug-in hybrid vehicle (PHV), a flying object such as a drone, a ship, a construction machine, an agricultural machine, and the like. In the following, examples in which the semiconductor device is applied to a vehicle as the movable body will be described.

First Embodiment

Firstly, a schematic configuration of a drive system of a vehicle will be described with reference to FIG. 1.
<Vehicle Drive System>

As shown in FIG. 1, a vehicle drive system 1 is provided with a DC power supply 2, a motor generator 3, and a power conversion device 4.

The DC power supply 2 is a direct-current (DC) voltage source including a chargeable/dischargeable secondary battery. The secondary battery is, for example, a lithium ion battery or a nickel hydride battery. The motor generator 3 is a three-phase alternating-current (AC) type rotary electric machine. The motor generator 3 functions as a vehicle driving power source, that is, an electric motor. The motor generator 3 functions also as a generator during regeneration. The power conversion device 4 performs electric power conversion between the DC power supply 2 and the motor generator 3.
<Power Conversion Device>

Next, a circuit configuration of the power conversion device 4 will be described with reference to FIG. 1. The power conversion device 4 includes a power conversion circuit. The power conversion device 4 includes a smoothing capacitor 5 and an inverter 6 as the power conversion circuit.

The smoothing capacitor 5 mainly smooths the direct-current voltage (DC voltage) supplied from the DC power supply 2. The smoothing capacitor 5 is connected between a P line 7 which is a power line on a high potential side and an N line 8 which is a power line on a low potential side. The P line 7 is connected to a positive electrode of the DC power supply 2, and the N line 8 is connected to a negative electrode of the DC power supply 2. The positive electrode of the smoothing capacitor 5 is connected to the P line 7 between the DC power supply 2 and the inverter 6. The negative electrode of the smoothing capacitor 5 is connected to the N line 8 between the DC power supply 2 and the inverter 6. The smoothing capacitor 5 is connected to the DC power supply 2 in parallel.

The inverter 6 is a DC-to-AC conversion circuit. The inverter 6 converts the DC voltage into a three-phase AC voltage according to a switching control by a control circuit (not shown), and outputs the three-phase AC voltage to the motor generator 3. Thus, the motor generator 3 is driven so as to generate a predetermined torque. At the time of regenerative braking of the vehicle, the inverter 6 converts the three-phase AC voltage generated by the motor generator 3 by receiving the rotational force from wheels into a DC voltage according to the switching control by the control circuit, and outputs the DC voltage to the P line 7. In this way, the inverter 6 performs bidirectional power conversion between the DC power supply 2 and the motor generator 3.

The inverter 6 includes upper and lower arm circuits 9 for three phases. The upper and lower arm circuits 9 are also referred to as legs. Each of the upper and lower arm circuits 9 has an upper arm 9H and a lower arm 9L. The upper arm 9H and the lower arm 9L are connected in series between the P line 7 and the N line 8 with the upper arm 9H connected adjacent to the P line 7. A connection point between the upper arm 9H and the lower arm 9L is connected to a winding 3a in a corresponding phase of the motor generator 3 via an output line 10. The inverter 6 has six arms. Each of the arms is provided with a switching element. For example, at least a part of each of the P line 7, the N line 8, and the output line 10 is made of a conductive member such as a bus bar.

In the present embodiment, the switching element of each arm is provided by an n-channel type metal-oxide-semiconductor field-effect transistor (MOSFET) 11. The number of switching elements constituting each arm is not particularly limited. The number of switching elements constituting each arm may be one or two or more.

In the present embodiment, as an example, each arm has a single MOSFET 11. In the upper arm 9H, a drain of the MOSFET 11 is connected to the P line 7. In the lower arm 9L, a source of the MOSFET 11 is connected to the N line 8. In the upper and lower arm circuit 9, a source of the MOSFET 11 of the upper arm 9H and a drain of the MOSFET 11 of the lower arm 9L are connected to each other.

Each MOSFET 11 is connected to a freewheeling diode 12 in anti-parallel. The diode 12 may be a parasitic diode (i.e., a body diode) of the MOSFET 11 or may be provided separately from the parasitic diode. An anode of the diode 12 is connected to the source of the corresponding MOSFET 11, and a cathode of the diode 12 is connected to the drain of the corresponding MOSFET 11.

The power conversion device 4 may further include a converter as the power conversion circuit. The converter is a DC-to-DC conversion circuit that converts the DC voltage to a DC voltage with different value. The converter is disposed between the DC power supply 2 and the smoothing capacitor 5. The converter is configured to include, for example, a reactor and the above-described upper and lower arm circuits 9. In such a configuration, it is possible to step up and down the voltage. The power conversion device 4 may further include a filter capacitor for removing power supply noise from the DC power supply 2. The filter capacitor is provided between the DC power supply 2 and the converter.

The power conversion device 4 may further include a drive circuit for driving switching elements of the inverter 6. The drive circuit supplies a drive voltage to the gate of the MOSFET 11 of the corresponding arm based on a drive command generated by the control circuit. The drive circuit drives the corresponding MOSFET 11, that is, turns on and off the corresponding MOSFET 11 by applying the drive voltage. The drive circuit may also be referred to as a driver.

The power conversion device 4 may include a control circuit for the switching element. The control circuit generates a drive command for operating the MOSFET 11, and outputs the drive command to the drive circuit. The control circuit generates the drive command based on a torque request received from a higher-level ECU (not shown) or signals detected by various sensors. Examples of various sensors include a current sensor, a rotation angle sensor, a voltage sensor, and the like. The current sensor detects the phase current flowing through the winding 3a of each phase. The rotation angle sensor detects a rotation angle of a rotor of the motor generator 3. The voltage sensor detects a voltage across the smoothing capacitor 5. The control circuit outputs, for example, a PWM signal as the drive command. The control circuit includes a processor and a memory, for example. ECU is an abbreviation for an electronic control unit. PWM is an abbreviation for a pulse width modulation.

<Semiconductor Device>

Figure 2:
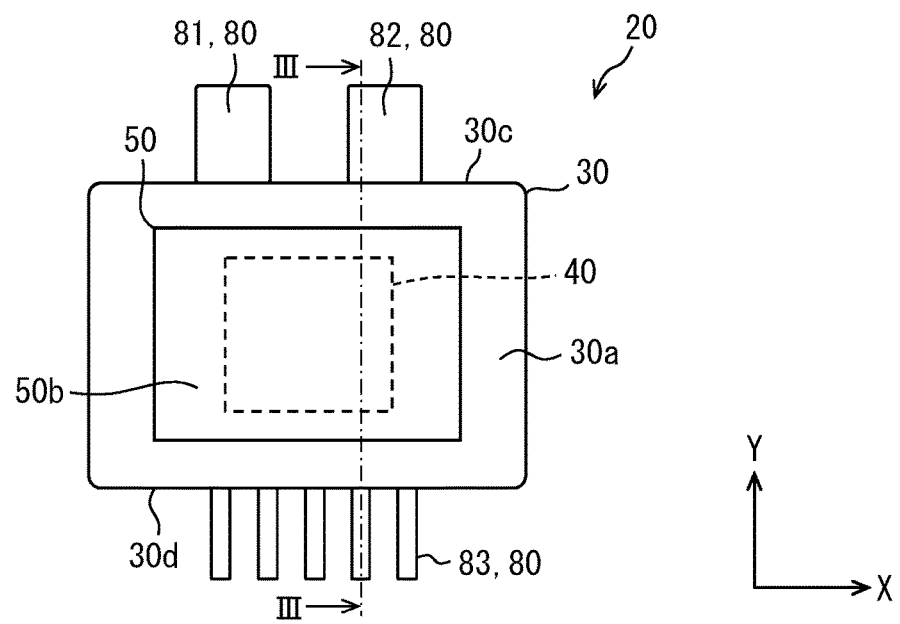
FIG. 2 is a plan view of the semiconductor device according to the first embodiment.
Figure 3:
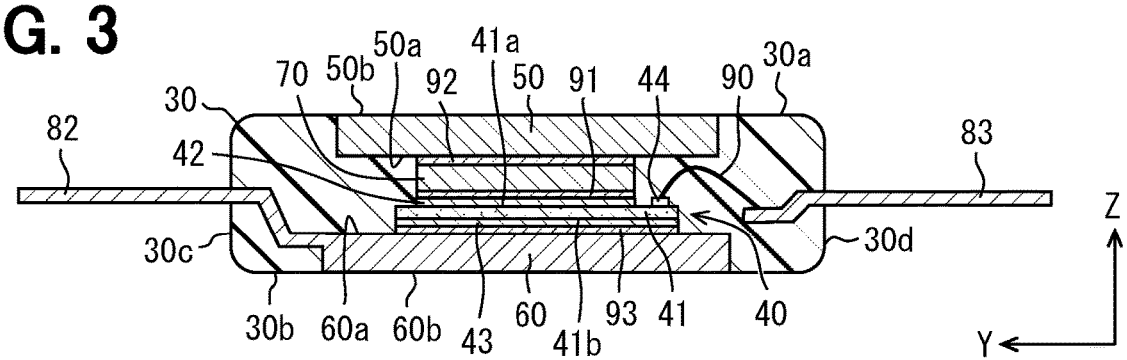
FIG. 3 is a cross-sectional view taken along a line III-III in FIG. 2.
Figure 4:
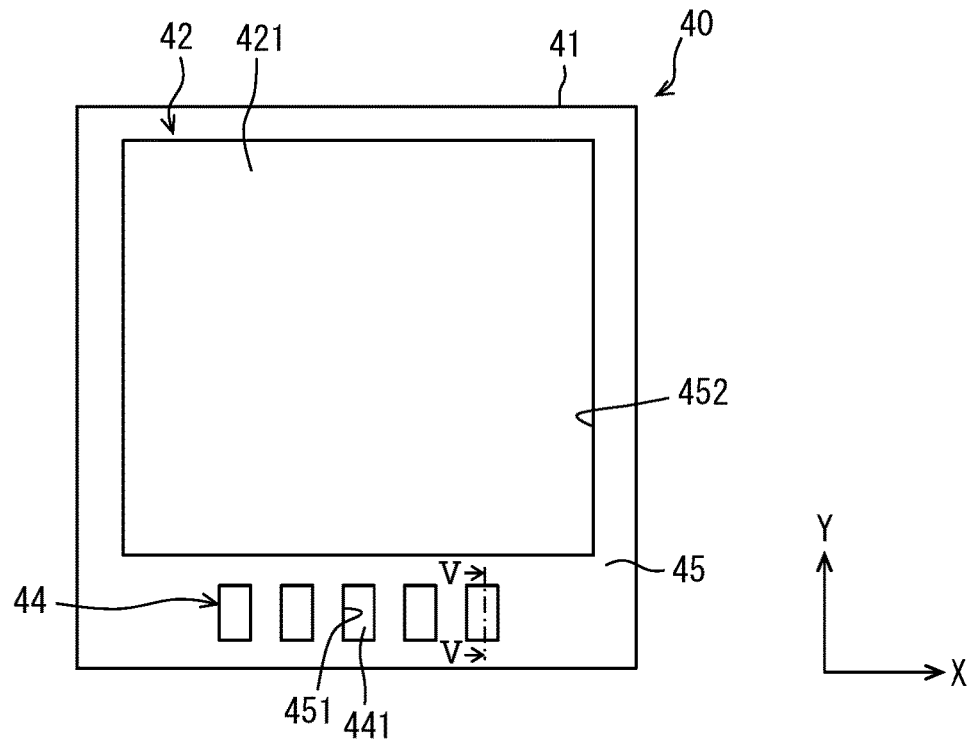
FIG. 4 is a plan view of a semiconductor element of the semiconductor device.

Next, a schematic configuration of a semiconductor device to which the semiconductor element is applied will be described with reference to FIGS. 2, 3, and 4. FIG. 2 is a plan view showing a semiconductor device. FIG. 2 is a top plan view of the semiconductor device. FIG. 3 is a cross-sectional view taken along a line III-III of FIG. 2. In the illustration of FIG. 3, the structure of the semiconductor element is simplified. FIG. 4 is a plan view showing the semiconductor element. FIG. 4 is a plan view when viewed from one side of the semiconductor substrate, that is, viewed from the source electrode side.

In the following, a plate thickness direction of a semiconductor substrate, that is, a direction normal to a surface of the semiconductor substrate is referred to as a Z direction. A direction orthogonal to the Z direction is referred to as an X direction. A direction orthogonal to both the Z direction and the X direction is referred to as a Y direction. Unless otherwise specified, a shape viewed along the Z direction, in other words, a shape along an XY plane including the X and Y directions is referred to as a planar shape. Further, the plan view when viewed along the Z direction may be simply referred to as a plan view.

As shown in FIGS. 2 and 3, the semiconductor device 20 includes an encapsulating body 30, a semiconductor element 40, heat sinks 50 and 60, a conductive spacer 70, an external connection terminal 80, and a bonding wire 90. The semiconductor device 20 constitutes one of the arms described above. That is, the upper and lower arm circuit 9 for one phase includes the two semiconductor devices 20. The semiconductor device 20 may be referred to as a power module.

The encapsulating body 30 is formed by using an electrically insulating material, and encapsulates a part of other elements constituting the semiconductor device 20. The rest of the other elements of the semiconductor device 20 are exposed to the outside of the encapsulating body 30. The encapsulating body 30 is made of, for example, a resin. An example of the resin is an epoxy resin. The encapsulating body 30 is molded by, for example, a transfer molding method using a resin as a material. Such an encapsulating body 30 may also be referred to as a sealing resin body, a mold resin, or a resin molded body. For example, the encapsulating body 30 may be formed using a gel. The gel is arranged between, that is, filled in the facing regions between the pair of heat sinks 50 and 60, for example.

As shown in FIG. 2, the encapsulating body 30 has a substantially rectangular shape in a plan view. The encapsulating body 30 has a first surface 30a and a second surface 30b as outer surfaces. The first surface 30a is opposite to the second surface 30b in the Z direction. The first surface 30a and the second surface 30b are, for example, flat surfaces. Further, the encapsulating body 30 has side surfaces 30c and 30d, which are surfaces connecting the first surface 30a and the second surface 30b. The semiconductor device 20 has external connection terminals 80 including main terminals 81 and 82 and signal terminals 83. The side surface 30c is a surface from which the main terminals 81 and 82 project. The side surface 30d is a surface opposite to the side surface 30c in the Y direction. The side surface 30d is a surface from which the signal terminals 83 project.

The semiconductor element 40 has a semiconductor substrate 41, a source electrode 42, a drain electrode 43, and pads 44. The semiconductor element 40 may be referred to as a power element, a semiconductor chip, or the like. The semiconductor substrate 41 is made of silicon (Si), a wide bandgap semiconductor having a wider bandgap than silicon, or the like. The semiconductor substrate 41 is formed with a vertical element. Examples of the wide bandgap semiconductor include silicon carbide (SiC), gallium nitride (GaN), gallium oxide ($Ga_2O_3$), and diamond.

The vertical element is configured to allow a main current to flow in the plate thickness direction of the semiconductor substrate 41 (semiconductor element 40), that is, in the Z direction. The vertical element is a heat generating element that generates heat when energized. In the present embodiment, the semiconductor substrate 41 is made of SiC, and is formed with a MOSFET 11 constituting one arm. The semiconductor substrate 41 is formed with a gate electrode (not shown). The gate electrode has, for example, a trench structure.

The semiconductor substrate 41 has a generally rectangular shape in a plan view. The semiconductor substrate 41 has a first surface 41a and a second surface 41b as plate surfaces on which the main electrodes are provided. The first surface 41a is a surface of the semiconductor substrate 41 adjacent to the first surface 30a of the encapsulating body 30. The second surface 41b is opposite to the first surface 41a in the plate thickness direction. A source electrode 42, which is one of the main electrodes, is disposed on the first surface 41a of the semiconductor substrate 41. A drain electrode 43, which is another one of the main electrodes, is disposed on the second surface 41b of the semiconductor substrate 41. The source electrode 42 corresponds to a first main electrode, and the drain electrode 43 corresponds to a second main electrode.

When the MOSFET 11 is turned on, a current, that is, a main current flows between the main electrodes, that is, between the source electrode 42 and the drain electrode 43. The drain electrode 43 is formed on almost the entire second surface 41b of the semiconductor substrate 41. The source electrode 42 is formed on a part of the first surface 41a of the semiconductor substrate 41.

The pad 44 is an electrode for a signal. The pad 44 is formed on the first surface 41a of the semiconductor substrate 41 at a position different from a formation region where the source electrode 42 is formed. The pad 44 is electrically separated from the source electrode 42. As shown in FIG. 4, the pad 44 is formed at an end portion opposite to the formation region of the source electrode 42 in the Y direction. The pad 44 is aligned with the source electrode 42 in the Y direction. The number of the pads 44 is not particularly limited. The pads 44 includes at least a pad for the gate electrode. The semiconductor device 40 of the present embodiment has five pads 44. The five pads 44 are aligned in the X direction.

The heat sinks 50 and 60 are metal plates made of a metal having high electrical conductivity such as Cu and Cu alloy. The heat sinks 50 and 60 are arranged so as to interpose the plurality of semiconductor elements 40 in the Z direction. The heat sinks 50 and 60 are arranged so as to overlap with each other at least at a part in the Z direction. The heat sinks 50 and 60 encompass the semiconductor element 40 in a plan view.

The heat sink 50 is electrically connected to the source electrode 42, and provides a wiring function. Similarly, the heat sink 60 is electrically connected to the drain electrode 43, and provides a wiring function. The heat sinks 50 and 60 also provide a heat dissipation function for dissipating heat generated by the semiconductor element 40. The heat sinks 50 and 60 may be formed with a plating film such as Ni or Au on the surface thereof. In the present embodiment, the heat sink 50 is electrically connected to the source electrode 42 via the conductive spacer 70. The heat sink 50 and the conductive spacer 70 correspond to a first wiring member. The heat sink 60 corresponds to a second wiring member.

The heat sink 50 has a facing surface 50a adjacent to the semiconductor element 40, and a back surface 50b opposite to the facing surface 50a in the Z direction. Similarly, the heat sink 60 has a facing surface 60a and a back surface 60b. The heat sinks 50 and 60 each have a generally rectangular shape in a plan view. The back surfaces 50b and 60b of the heat sinks 50 and 60 are exposed from the encapsulating body 30. The back surfaces 50b and 60b may be referred to as heat dissipation surfaces, exposed surfaces, or the like. The back surface 50b of the heat sink 50 is substantially coplanar with the first surface 30a of the encapsulating body 30. The back surface 60b of the heat sink 60 is substantially coplanar with the second surface 30b of the encapsulating body 30.

The conductive spacer 70 is interposed between the semiconductor element 40 and the heat sink 50. The conductive spacer 70 provides a spacer function for ensuring a predetermined distance between the semiconductor element 40 and the heat sink 50. For example, the conductive spacer 70 secures a height for allowing electric connection of the signal terminals 83 to the respective pads 44 of the semiconductor element 40. The conductive spacer 70 is located on an electrical and heat conduction path between the source electrode 42 of the semiconductor element 40 and the heat sink 50, and provides a wiring function and a heat dissipation function.

The conductive spacer 70 contains a metal material having high electrical conductivity and thermal conductivity such as Cu. The conductive spacer 70 may be formed with a plating film on the surface thereof. The conductive spacer 70 may be referred to as a terminal, a terminal block, a metal block body, or the like. The semiconductor device 20 includes the same number of conductive spacers 70 as the semiconductor elements 40. The conductive spacers 70 are individually connected to the respective semiconductor elements 40. The conductive spacer 70 is, for example, a columnar body having a generally rectangular shape in a plan view. The conductive spacer 70 has a size substantially equal to or slightly smaller than the joining region of the source electrode 42 in a plan view.

The external connection terminal 80 is a terminal for electrically connecting the semiconductor device 20 to an external device. The external connection terminal 80 is formed by using a metal material having high electrical conductivity such as copper. The external connection terminal 80 is, for example, a plate member. The external connection terminal 80 may be referred to as a lead. The external connection terminal 80 includes the main terminals 81 and 82 and the signal terminals 83. The main terminals 81 and 82 are external connection terminals electrically connected to the main electrodes of the semiconductor element 40.

The main terminal 81 is electrically connected to the source electrode 42. The main terminal 81 may be referred to as a source terminal. The main terminal 81 is connected to the source electrode 42 via the heat sink 50. The main terminal 81 connects to an end of the heat sink 50 in the Y direction. The main terminal 81 has a thickness smaller than that of the heat sink 50. The main terminal 81 connects to the heat sink 50 so as to have a surface substantially coplanar with the facing surface 50a, for example. The main terminal 81 and the heat sink 50 may be provided by an integral member, so that the main terminal 81 connects to the heat sink 50. Alternatively, the main terminal 81 and the heat sink 50 may be provided by separate members, and be connected to each other so that the main terminal 81 connects to the heat sink 50.

The main terminal 81 of the present embodiment is integrated into the heat sink 50 as a part of the lead frame. The main terminal 81 extends from the heat sink 50 in the Y direction and projects to the outside of the encapsulating body 30 from the side surface 30c of the encapsulating body 30. The main terminal 81 has a bent portion in a middle of the portion covered by the encapsulating body 30, and projects from the side surface 30c at a position near the center in the Z direction on the side surface 30c.

The main terminal 82 is electrically connected to the drain electrode 43. The main terminal 82 may be referred to as a drain terminal. The main terminal 82 is connected to the drain electrode 43 via the heat sink 60. The main terminal 82 connects to an end of the heat sink 60 in the Y direction. The main terminal 82 has a thickness smaller than that of the heat sink 60. The main terminal 82 connects to the heat sink 60 so as to have a surface substantially coplanar with the facing surface 60a, for example. The main terminal 82 and the heat sink 60 may be provided by an integral member, so that the main terminal 82 connects to the heat sink 60. Alternatively, the main terminal 82 and the heat sink 60 may be provided by separate members, and be connected to each other so that the main terminal 82 connects to the heat sink 60.

The main terminal 82 of the present embodiment is integrated into the heat sink 60 as a part of a lead frame that is separate from the main terminal 81. The main terminal 82 extends from the heat sink 60 in the Y direction, and projects to the outside of the encapsulating body 30 from the same side surface 30c as the main terminal 81. The main terminal 82 also has a bent portion in a middle of the portion covered by the encapsulating body 30, and projects from the side surface 30c at a position near the center in the Z direction on the side surface 30c. The two main terminals 81 and 82 are arranged side by side in the X direction so that side surfaces of the main terminals 81 and 82 face each other in the X direction.

The signal terminal 83 is electrically connected to the pad 44 of the semiconductor element 40 via the bonding wire 90. The semiconductor device 20 includes a plurality of the signal terminals 83. The signal terminals 83 extend in the Y direction, and project from the side surface 83d of the encapsulating body 30. The signal terminals 83 are formed in a lead frame common to, for example, the heat sink 60 and the main terminal 82. The plurality of signal terminals 83 are electrically separated from each other by cutting a tie bar (not shown) of the lead frame.

The source electrode 42 of the semiconductor element 40 is joined to the conductive spacer 70 via a joining material 91. The conductive spacer 70 is joined to the heat sink 50 via a joining material 92. The drain electrode 43 of the semiconductor element 40 is joined to the heat sink 60 via a joining material 93. The joining materials 91, 92, and 93 are electrically conductive joining materials. For example, solder can be used as the joining materials 91, 92 and 93. An example of the solder is a multi-element lead-free solder containing Cu, Ni, or the like in addition to Sn. Instead of the solder, a sinter-based joining material such as sintered silver may be used. The joining materials 91, 92 and 93 may be provided by a material common to each other. Alternatively, at least one material may be different from the others between the joining materials 91, 92 and 93. In the present embodiment, solder is used as the joining materials 91, 92, and 93.

As described above, in the semiconductor device 20, the semiconductor element 40 constituting one arm is encapsulated by the encapsulating body 30. The encapsulating body 30 encapsulates integrally the semiconductor element 40, a part of the heat sink 50, a part of the heat sink 60, the conductive spacer 70, a part of each of the external connection terminals 80, and the bonding wire 90.

In the Z-direction, the semiconductor element 40 is disposed between the heat sink 50 and the heat sink 60. The semiconductor element 40 is interposed between the heat sink 50 and the heat sink 60, which are arranged so as to face each other. As a result, the heat of the semiconductor element 40 can be dissipated on both sides in the Z direction. The semiconductor device 20 has a double-sided heat dissipation structure. The back surface 50b of the heat sink 50 is substantially coplanar with the first surface 30a of the encapsulating body 30. The back surface 60b of the heat sink 60 is substantially coplanar with the second surface 30b of the encapsulating body 30. Since the back surfaces 50b and 60b are exposed surfaces, heat dissipation can be improved.

<Pads>

Figure 5:
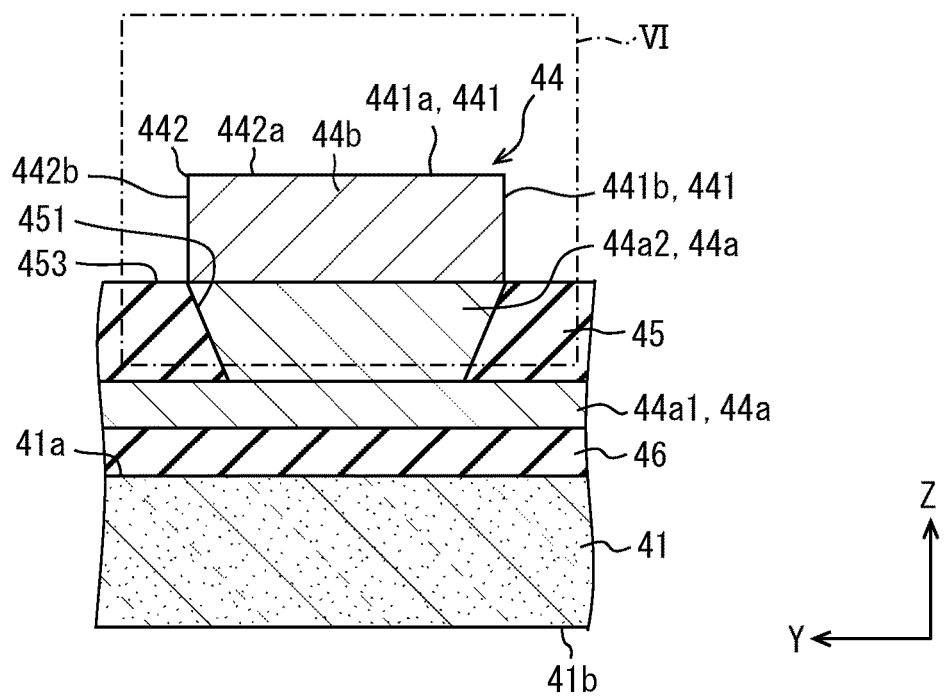
FIG. 5 is a cross-sectional view taken along a line V-V in FIG. 4.
Figure 6:
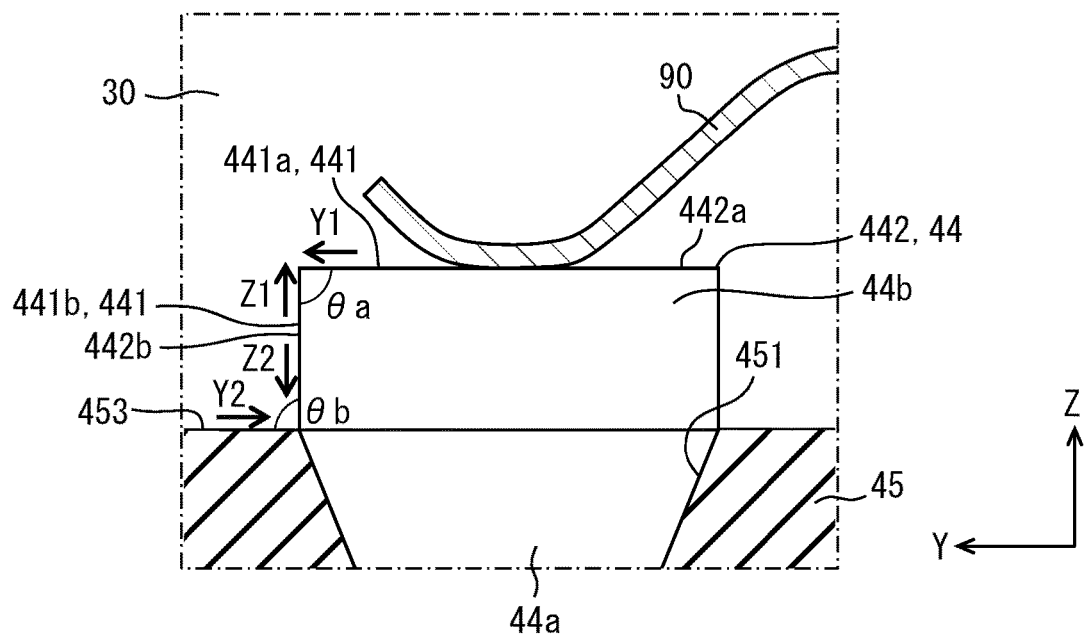
FIG. 6 is an enlarged view of a region VI shown in FIG. 5.

Next, the pads 44 of the semiconductor element 40 will be described with reference to FIGS. 4, 5, and 6. FIG. 5 is a cross-sectional view taken along a line V-V of FIG. 4. In FIG. 5, the drain electrode 43 is not shown for convenience. FIG. 6 shows a protruded shape of the pad 44. FIG. 6 is an enlarged view of the region VI shown by an alternate long and short dash line in FIG. 5. In FIG. 6, the encapsulating body 30 and the bonding wire 90 are also shown. For clarity, in the cross-section of FIG. 6, hatchings of the encapsulating body 30 and the pads 44 are deliberately omitted.

As shown in FIGS. 4 and 5, the semiconductor element 40 has a protective film 45 disposed on the first surface 41a of the semiconductor substrate 41. The protective film 45 is an insulating film. As the material of the protective film 45, for example, polyimide, a silicon nitride film, or the like can be adopted. The protective film 45 has openings 451. The openings 451 are provided individually and correspondingly to the pads 44. The opening 451 is provided so as to overlap the corresponding pad 44 in a plan view. Each of the pads 44 has an exposed surface 441 exposed from the opening 451.

The protective film 45 has an opening 452. The opening 452 is provided so as to overlap with the source electrode 42. The source electrode 42 has an exposed surface 421 exposed from the opening 452. The opening 451 may be referred to as a first opening, and the opening 452 may be referred to as a second opening.

The exposed surface 441 has a connection area 441a and a peripheral area 441b. The connection area 441a is an area of the exposed surface 441 to which the bonding wire 90 is connected. The peripheral area 441b is an area around the connection area 441a in the exposed surface 441. For example, the peripheral area 441b surrounds the connection area 441a.

In the present embodiment, the pad 44 has a protruded portion 442 that protrudes from an opening peripheral edge 453 of the protective film 45. The opening peripheral edge 453 is a peripheral edge portion of the opening 451 in the upper surface of the protective film 45. The opening peripheral edge 453 corresponds to the peripheral edge of the opening. The protruded portion 442 protrudes upward from the opening peripheral edge 453 (upper surface) of the protective film 45 in the Z direction. The protruded portion 442 maybe referred to as a pad protruded portion.

The pad 44 has a multi-layer structure. The pad 44 has a base layer 44a and an upper layer 44b. The base layer 44a is formed by using, for example, a material containing aluminum (Al) as a main component. In the present embodiment, as the material of the base layer 44a, an Al alloy such as AlSi or AlSiCu is used. The base layer 44a of the present embodiment has a first layer 44a1 and a second layer 44a2.

The first layer 44a1 is arranged on the first surface 41a of the semiconductor substrate 41 through an interlayer insulating film 46. The first layer 44a1 is disposed in an area immediately below the opening 451 and a periphery of the area in a plan view. A peripheral portion of the first layer 44a1 is covered with the protective film 45. The second layer 44a2 is stacked on a portion of the first layer 44a1 exposed from the opening 451. The second layer 44a2 is arranged in the opening 451. The second layer 44a2 of the present embodiment is arranged so as to substantially coincide with the opening 451. The lower end of the second layer 44a2 substantially coincides with the lower end of the opening 451 and the upper end of the second layer 44a2 substantially coincides with the upper end of the opening 451, in the Z direction. The second layer 44a2 fills the opening 451 with almost no gap. The first layer 44a1 and the second layer 44a2 are formed by using the same material, for example, the Al alloy.

The upper layer 44b is stacked and arranged on the base layer 44a. The upper layer 44b may also be referred to as a connection layer. The upper layer 44b includes at least one metal layer. The metal layer of the upper layer 44b contains, for example, nickel (Ni), palladium (Pd), gold (Au), platinum (Pt), or silver (Ag). The upper layer 44b of the present embodiment includes at least a Ni layer. Ni is harder than the Al alloy of the base layer 44a. The upper layer 44b may further include an Au layer on the Ni layer.

The upper layer 44b of the present embodiment is a columnar body that substantially coincides with the upper end of the base layer 44a in a plan view and extends in the Z direction. The upper layer 44b is provided so as to substantially coincide with the opening edge of the opening 451 on the upper surface of the protective film 45 in a plan view. The lower end of the upper layer 44b substantially coincides with the opening peripheral edge 453 of the protective film 45 in the Z direction. The upper layer 44b provides the protruded portion 442 of the pad 44.

The surface of the protruded portion 442 provides the exposed surface 441 of the pad 44. The protruded portion 442 has an upper surface 442a and a side surface 442b. The upper surface 442a is a protruding tip surface. The upper surface 442a provides the connection area 441a. Further, the side surface 442b provides the peripheral area 441b.

In the present embodiment, almost the entire area of the upper surface 442a providing the connection area 441a is a plane substantially parallel to the XY plane. The upper surface 442a is a generally flat surface. The upper surface 442a has a generally rectangular shape having a longitudinal direction in the Y direction. Further, almost the entire area of the side surface 442b that provides the peripheral area 441b is a plane substantially parallel to the Z direction. As a result, the relative angle θa defined between the upper surface 442a and the side surface 442b, that is, the relative angle between the connection area 441a and the peripheral area 441b is 90 degrees. The relative angle θa between the upper surface 442a and the side surface 442b is the angle defined between the upper surface 442a and the side surface 442b.

Further, in the present embodiment, the opening peripheral edge 453 of the protective film 45 is substantially parallel to the XY plane. As a result, the relative angle θb defined between the side surface 442b and the opening peripheral edge 453 of the protective film 45 is 90 degrees.

Similar to the pad 44, the source electrode 42 also has a multi-layer structure. In the source electrode 42, however, the base layer has only the first layer, and the upper layer is stacked on the first layer. The base layer is connected to the semiconductor substrate 41 via a contact hole (not shown) of the interlayer insulating film 46. The upper layer is arranged in the opening 452.

The pad 44 having the above-described structure can be formed, for example, by a method shown below. First, the first layer 44a1 is formed on the interlayer insulating film 46 by, for example, a sputtering method. Next, the protective film 45 is formed so as to cover the first layer 44a1, for example, by spin coating. Further, the protective film 45 is patterned by etching using a photoresist as a mask so as to form the openings 451 and 452.

Next, the second layer 44a2 is formed into a film by, for example, a sputtering method. In this case, the second layer 44a2 is formed so as to fill the opening 451. Then, the second layer 44a2 is patterned by etching using a photoresist as a mask, so that the second layer 44a2 is left only in the opening 452. Next, the upper layer 44b is formed into a film on the second layer 44a2 by a plating method. In this way, the pad 44 having the protruded portion 442 is formed.

Summary of First Embodiment

The semiconductor element 40 generates heat due to a large amount of current flowing therein. By repeatedly turning on and off the semiconductor element 40, that is, the MOSFET 11, the semiconductor device 20 repeats an overheated state and a cooled state. As a result, thermal stress due to the difference in the coefficient of linear expansion acts on the components of the semiconductor device 20.

In the present embodiment, in the exposed surface 441 of the pad 44, the relative angle between the surface of at least a part of the peripheral area 441b and the surface of the connection area 441a is 90 degrees. Therefore, on the exposed surface 441, it is less likely that the peeling of the encapsulating body 30 will progress between the peripheral area 441b and the connection area 441a.

For example, even if the encapsulating body 30 is peeled off from the surface of the peripheral area 441b, the peeling does not easily progress to the surface of the connection area 441a. As a result, it is possible to suppress an occurrence of electrical connection defects such as cracks and disconnections due to stress acting on the connection portion (joining portion) between the bonding wire 90 and the pad 44. Further, even if a crack occurs in the connection portion between the bonding wire 90 and the pad 44 due to thermal stress, it is less likely that the peeling of the encapsulating body 30 with respect to the connection area 441a starting from the crack will progress to the surface of the peripheral area 441b. Accordingly, the semiconductor device 20 having a high reliability can be provided.

In the present embodiment, the pad 44 has the protruded portion 442 that protrudes from the opening peripheral edge 453 of the protective film 45. In the protruded portion 442, the angle θa defined between the upper surface 442a providing the connection area 441a and the side surface 442b providing the peripheral area 441b is 90 degrees. For example, as shown in FIG. 6, even if the peeling of the encapsulating body 30 from the side surface 442b progresses in the Z1 direction, it is possible to suppress the peeling from progressing toward the upper surface 442a. Further, even if the peeling of the encapsulating body 30 from the upper surface 442a progresses in the Y1 direction shown in FIG. 6, it is possible to suppress the peeling from progressing toward the side surface 442b.

In the present embodiment, the angle θb defined between the side surface 442b of the protruded portion 442 and the opening peripheral edge 453 of the protective film 45 is 90 degrees. For example, as shown in FIG. 6, even if the peeling of the encapsulating body 30 from the protective film 45 progresses in the Y2 direction, it is possible to suppress the peeling from progressing toward the side surface 442b. Further, even if the peeling of the encapsulating body 30 from the side surface 442b progresses in the Z2 direction shown in FIG. 6, it is possible to suppress the peeling from progressing toward the opening peripheral edge 453 of the protective film 45, that is, the upper surface side of the protective film 45.

In the configuration having the protruded portion 442, if the peeling progresses in the Y2 direction described above, it will reach the protruded portion 442. When the angle θb is an obtuse angle, that is, larger than 90 degrees, the peeling may progress on the interface with the side surface 442b due to the Y-direction component. In the present embodiment, since the angle θb is 90 degrees, the progress of peeling can be effectively suppressed. As a result, for example, it is possible to effectively suppress the peeling occurred at the interface between the encapsulating body 30 and the protective film 45 from progressing to the connecting portion (joining portion) between the bonding wire 90 and the pad 44. That is, it is possible to suppress occurrences of the cracks and disconnections at the connection portion between the bonding wire 90 and the pad 44 due to the progress of peeling. The progress of the peeling can be effectively suppressed by the synergistic effect of the part forming the angle θa and the part forming the angle θb.

<Modifications>

Figure 7:
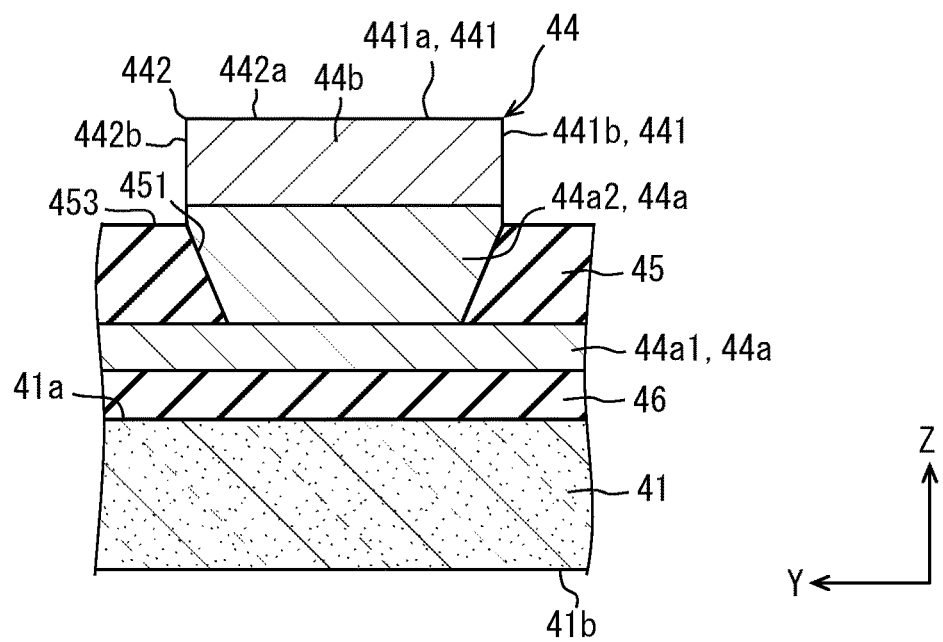
FIG. 7 is a cross-sectional view of a part of a semiconductor element as a modification.

The example in which the protruded portion 442 is provided by only the upper layer 44b has been described above. However, the configuration of the protruded portion 442 is not limited to the example described above. For example, as shown in FIG. 7, the protruded portion 442 may be provided by the base layer 44a and the upper layer 44b. In FIG. 7, the second layer 44a2 is filled in the opening 451 of the protective film 45 and is arranged to a level above the opening peripheral edge 453. Almost the entire area of the side surface 442b is substantially parallel to the Z direction. The protruded portion 442 may be formed by film-forming the second layer 44a2 to the level above the upper end of the opening 451 and patterning. FIG. 7 is a cross-sectional view corresponding to FIG. 5.

The example in which the relative angle between at least a part of the surface of the peripheral area 441b and the surface of the connection area 441a is 90 degrees has been described above. However, the configuration is not limited to the example described above. The relative angle between at least a part of the surface of the peripheral area 441b and the surface of the connection area 441a may be smaller than 90 degrees. That is, the angle θa may be an acute angle. By making the angle sharp, the progress of peeling can be suppressed more effectively.

Figure 8:
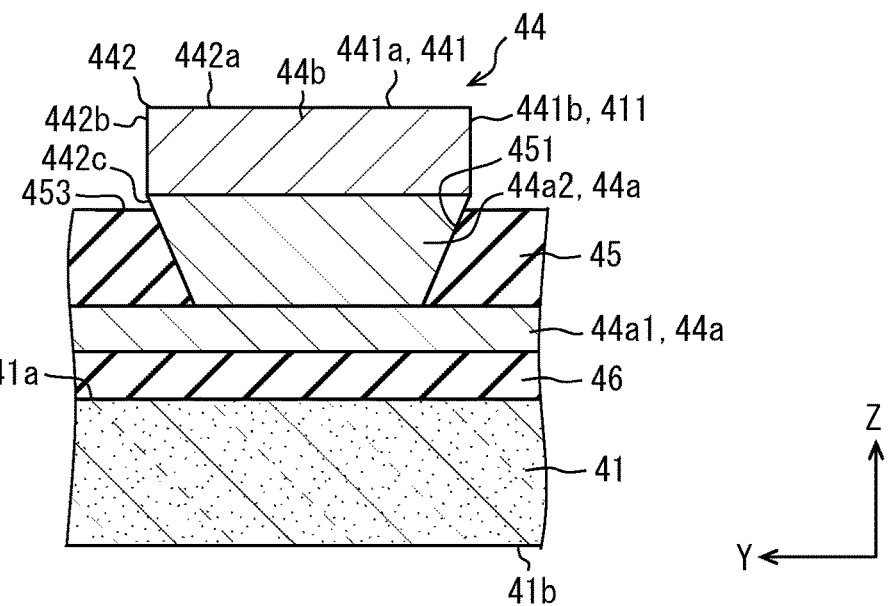
FIG. 8 is a cross-sectional view of a part of a semiconductor element as a modification.

The example in which the angle θb is 90 degrees has been described above. However, the angle is not limited to 90 degrees, as in the example described above. As shown in FIG. 8, the angle defined between the side surface 442b and the opening peripheral edge 453, that is, the above-mentioned angle θb may be an acute angle. FIG. 8 is a cross-sectional view corresponding to FIG. 5. In FIG. 8, as in FIG. 7, the protruded portion 442 is made of the base layer 44a and the upper layer 44b. When patterning the second layer 44a2, etching is performed so that the side surface is tapered. As a result, the angle θb formed by a predetermined range from the lower end of the protruded portion 442 and the opening peripheral edge 453 on the side surface 442b is made smaller than 90 degrees.

The side surface 442b of the protruded portion 442 may have a groove. In such a case, it is possible to improve the adhesion of the encapsulating body 30 with the side surface 442b. That is, it is possible to suppress the progress of peeling via the side surface 442b.

Second Embodiment

A second embodiment is a modification of the preceding embodiment as a basic configuration and may incorporate description of the preceding embodiment. In the first embodiment, the pad 44 is provided with the protruded portion 442. In place of the protruded portion 442, the pad 44 may be provided with a recessed portion.

Figure 9:
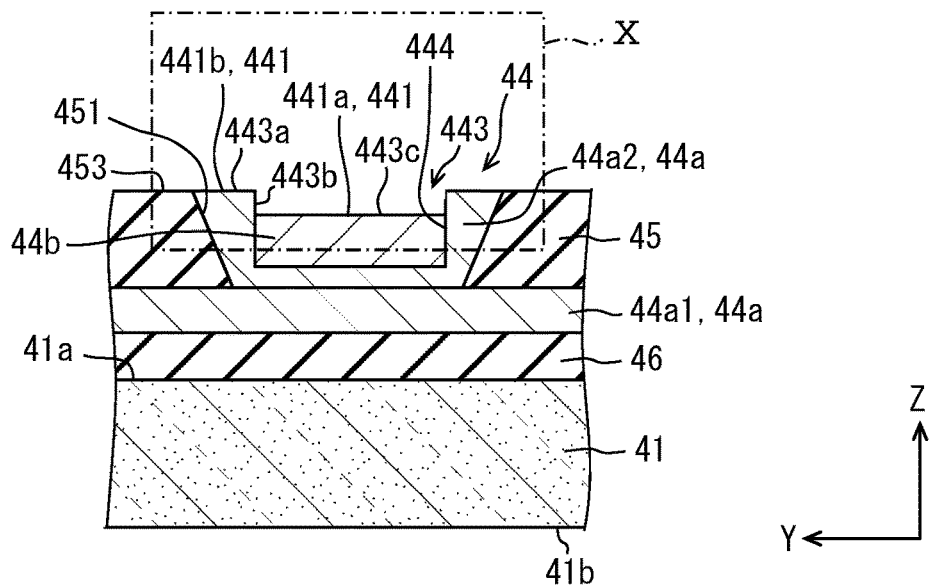
FIG. 9 is a cross-sectional view of a part of a semiconductor element around a pad, in a semiconductor device according to a second embodiment.
Figure 10:
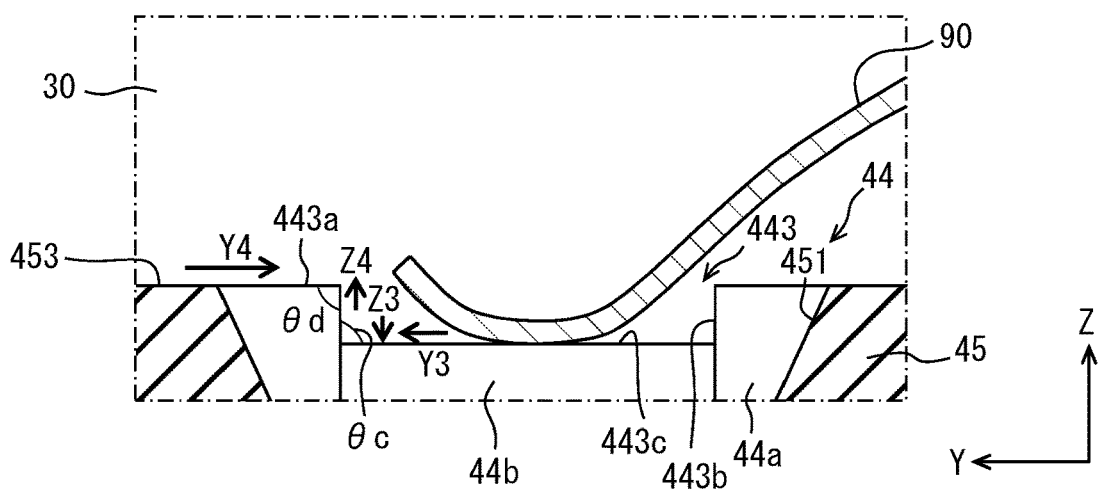
FIG. 10 is an enlarged view of a region X shown in FIG. 9.

FIG. 9 is a cross-sectional view showing the periphery of the pad of the semiconductor element 40 in the semiconductor device 20 according to the present embodiment. FIG. 9 is a cross-sectional view corresponding to FIG. 5. In FIG. 9, the drain electrode 43 is not shown for convenience. FIG. 10 shows the recessed portion of the pad 44. FIG. 10 is an enlarged view of the region X shown by the alternate long and short dash line in FIG. 9. In FIG. 10, the encapsulating body 30 and the bonding wire 90 are also shown. For clarity, hatchings of the encapsulating body 30 and pad 44 are deliberately omitted in FIG. 10.

As shown in FIGS. 9 and 10, in the present embodiment, the pad 44 has a recessed portion 443. The recessed portion 443 may be also referred to as a pad recessed portion. The recessed portion 443 is located in the opening 451 of the protective film 45. The pad 44 is configured to include the base layer 44a and the upper layer 44b as in the first embodiment. The second layer 44a2 is arranged in the opening 451. The lower end of the second layer 44a2 substantially coincides with the lower end of the opening 451 and the upper end of the second layer 44a2 substantially coincides with the upper end of the opening 451.

The second layer 44a2 has a groove 444 that opens at the upper end (upper surface). The groove 444 has a depth that does not reach the lower end of the second layer 44a2. The upper layer 44b is arranged in the groove 444. The upper layer 44b is filled in the groove 444 to a level lower than the upper surface of the second layer 44a2.

The pad 44 has an upper surface 443a, a side surface 443b, and a bottom surface 443c as wall surfaces defining the recessed portion 443. The upper surface 443a is the upper end (upper surface) of the second layer 44a2. The side surface 443b is a surface that defines a part of the side surface of the groove 444 in the second layer 44a2. The bottom surface 443c is provided by the upper surface of the upper layer 44b. The bottom surface 443c provides the connection area 441a of the exposed surface 441. Further, the upper surface 443a and the side surface 443b provide the peripheral area 441b.

In the embodiment, almost the entire area of the bottom surface 443c that provides the connection area 441a is substantially parallel to the XY plane. The bottom surface 443c is a generally flat surface. The bottom surface 443c has a generally rectangular shape having the longitudinal direction in the Y direction, for example. Further, almost the entire area of the side surface 443b that provides the peripheral area 441b is generally parallel to the Z direction. As a result, a relative angle θc defined between the bottom surface 443c and the side surface 443b, that is, the relative angle between the connection area 441a and the peripheral area 441b is 90 degrees. The relative angle θc between the bottom surface 443c and the side surface 443b is the angle defined between the bottom surface 443c and the side surface 443b.

Further, in the present embodiment, the upper surface 443a is substantially parallel to the XY plane. The upper surface 443a is substantially coplanar with the opening peripheral edge 453. As a result, a relative angle θd between the side surface 443b and the upper surface 443a, that is, the relative angle between the side surface 443b and the opening peripheral edge 453 is 90 degrees. Other configurations of the present embodiment are the same as those described in the preceding embodiment.

The pad 44 having the structure described above can be formed, for example, by a method shown below. First, the first layer 44a1 is formed on the interlayer insulating film 46 by, for example, a sputtering method. Then, the protective film 45 is formed so as to cover the first layer 44a1, for example, by a spin coating. Then, the protective film 45 is patterned by conducting etching using the photoresist as a mask to form the openings 451 and 452.

Next, the second layer 44a2 is formed into a film by, for example, a sputtering method. At this time, the second layer 44a2 is formed so as to fill the opening 451. Then, the second layer 44a2 is patterned by conducting etching using the photoresist as a mask. As a result, the second layer 44a2 is left only in the opening 452, and the groove 444 is formed in the second layer 44a2. Next, the upper layer 44b is formed in the groove 444 of the second layer 44a2 by a plating method. In this way, the pad 44 having the recessed portion 443 can be formed.

Summary of Second Embodiment

Also in the present embodiment, on the exposed surface 441 of the pad 44, the relative angle between the surface of at least a part of the peripheral area 441b and the surface of the connection area 441a is 90 degrees. Therefore, on the exposed surface 441, it is less likely that the peeling of the encapsulating body 30 will progress between the peripheral area 441b and the connection area 441a. As such, it is possible to provide a highly reliable semiconductor device 20.

In the present embodiment, the pad 44 has the recessed portion 443 inside the opening 451 of the protective film 45. The angle $\theta c$ defined between the bottom surface 443c providing the connection area 441a and the side surface 443b providing the peripheral area 441b is 90 degrees. For example, as shown in FIG. 10, even if the peeling of the encapsulating body 30 with respect to the side surface 443b progresses in the Z3 direction, it is possible to suppress the peeling from progressing toward the bottom surface 443c. Further, even if the peeling of the encapsulating body 30 with respect to the bottom surface 443c progresses in the Y3 direction shown in FIG. 10, it is possible to suppress the peeling from progressing toward the side surface 443b.

In the present embodiment, the angle $\theta d$ defined between the side surface 443b and the upper surface 443a, that is, the angle defined between the side surface 443b and the opening peripheral edge 453 is 90 degrees. For example, as shown in FIG. 10, even if the peeling of the encapsulating body 30 with respect to the protective film 45 progresses in the Y4 direction, it is possible to suppress the peeling from progressing toward the side surface 443b. Further, even if the peeling of the encapsulating body 30 with respect to the side surface 443b progresses in the Z4 direction shown in FIG. 10, it is possible to suppress the peeling from progressing to the opening peripheral edge 453, that is, to the upper surface side of the protective film 45.

In the configuration having the recessed portion 443, if the peeling progresses in the Y3 direction described above, the peeling may reach the side surface 443b. When the angle $\theta c$ is an obtuse angle, that is, larger than 90 degrees, the peeling is likely to progress along the interface with the side surface 443b due to the Y-direction component. In the present embodiment, since the angle $\theta c$ is 90 degrees, the progress of peeling can be effectively suppressed. As a result, it is possible to effectively suppress the peeling starting from the crack at the connection portion (joining portion) between the bonding wire 90 and the pad 44 from progressing to a periphery of the pad 44. For example, it is possible to suppress the connection reliability of the source electrode 42 from degrading due to the peeling progressing toward the source electrode 42. Further, it is possible to suppress short-circuit between the source electrode 42 and the drain electrode 43 due to the progress of the peeling to the outer peripheral edge of the semiconductor element 40. That is, it is possible to suppress the degradation of the insulation reliability. The progress of the peeling can be effectively suppressed by the synergistic effect of the part forming the angle $\theta c$ and the part forming the angle $\theta d$.

<Modifications>

Figure 11:
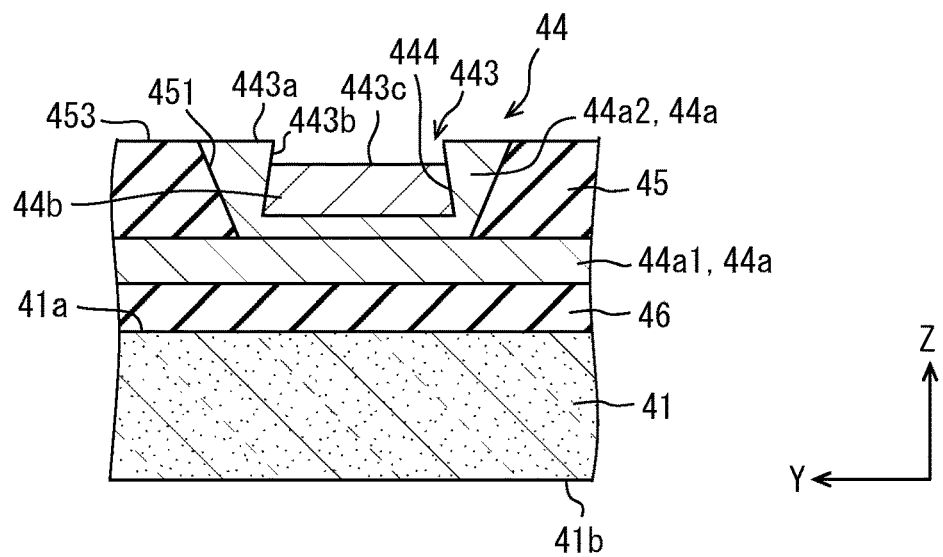
FIG. 11 is a cross-sectional view of a part of a semiconductor element as a modification.

An example in which the relative angle between at least a part of the surface of the peripheral area 441b and the surface of the connection area 441a is 90 degrees has been described above. However, the present disclosure is not limited such an example. The relative angle between at least a part of the surface of the peripheral area 441b and the surface of the connection area 441a may be smaller than 90 degrees. In an example shown in FIG. 11, the angle defined between the bottom surface 443c and the side surface 443b, that is, the angle $\theta c$ described above is an acute angle. Such a structure can be obtained by conducting etching so that the groove 444 has a reversed taper shape when the second layer 44a2 is patterned. When the angle $\theta c$ is an acute angle, the progress of peeling can be suppressed more effectively. FIG. 11 is a cross sectional view corresponding to FIG. 9.

The angle $\theta d$ is not limited to 90 degrees. As shown in FIG. 11, the angle $\theta d$ may be an angle smaller than 90 degrees, that is, an acute angle.

Third Embodiment

A present embodiment is a modification of the preceding embodiments as a basic configuration and may incorporate description of the preceding embodiments. In the preceding embodiments, the pad 44 is provided with the protruded portion 442 or the recessed portion 443. Alternatively, the protective film 45 may be provided with a protruded portion and/or a recessed portion.

Figure 12:
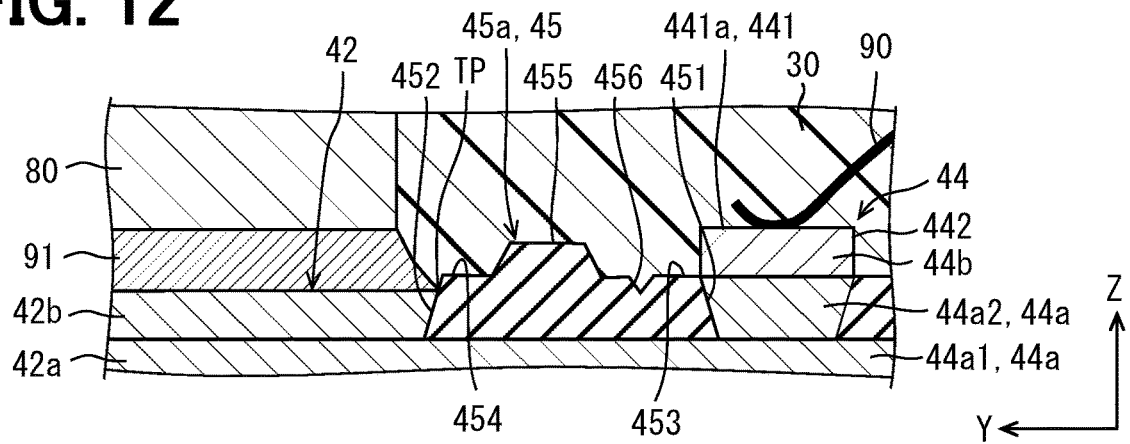
FIG. 12 is a cross-sectional view of a part of a semiconductor device according to a third embodiment, the part including a protective film between a source electrode and a pad.

FIG. 12 is a cross-sectional view showing the periphery of the protective film between the source electrode 42 and the pad 44 in the semiconductor device 20 according to the present embodiment. In FIG. 12, illustrations of the semiconductor substrate 41 and the like are omitted.

The source electrode 42 has a multi-layer structure as described above. The source electrode 42 has a base layer 42a and an upper layer 42b. The base layer 42a is formed of the same material as the base layer 44a, for example, an Al alloy.

The upper layer 42b is stacked and arranged on the base layer 42a exposed from the opening 452. The upper layer 42b is arranged in the opening 452. The upper surface of the upper layer 42b is located lower than an opening peripheral edge 454 of the protective film 45. The opening peripheral edge 454 is a peripheral edge portion of the opening 452 on the upper surface of the protective film 45.

The upper layer 42b has the same structure as that of the upper layer 44b of the pad 44. The upper layer 42b contains at least a Ni layer. Ni is harder than the Al alloy constituting the base layer 42a. The upper layer 42b may further include an Au layer on the Ni layer. The Au layer, for example, suppresses the oxidation of the Ni layer and improves the wettability with the solder. Au diffuses into the solder during soldering. In a case where the bonding material 91 is solder, the Au layer exists in the state before the solder bonding and does not exist in the solder-bonded state.

The source electrode 42 may be electrically connected to one of the pads 44. The pad 44 shown in FIG. 12 is a pad for a Kelvin source that detects the source potential of the MOSFET 11 formed on the semiconductor substrate 41. The base layer 42a of the source electrode 42 and the first layer 44a1 of the pad 44 for the Kelvin source are electrically connected to each other. The first layer 44a1 of the other pads 44 is electrically separated from the base layer 42a of the source electrode 42.

The protective film 45 includes a protective film portion 45a. The protective film portion 45a is a portion of the protective film 45 arranged between the source electrode 42 and the pad 44 in a plan view. The protective film portion 45*a* has a protruded portion 455 and a recessed portion 456. The protruded portion 455 connects to the opening peripheral edge 454. The protruded portion 455 protrudes upward from the opening peripheral edge 454 in the Z direction. The recessed portion 456 connects to the opening peripheral edge 453. The recessed portion 456 is recessed with respect to the opening peripheral edge 453 in the Z direction. The recessed portion 456 of the protective film portion 45*a* may be also referred to as a film recessed portion, and the protruded portion 455 of the protective film portion 45*a* may be also referred to as a film protruded portion. Other configurations of the semiconductor device 20 of the present embodiment are the same as those of the semiconductor device 20 of the embodiments described above. The pad 44 has the same configuration as that of the first embodiment described above with reference to FIG. 5.

Summary of Third Embodiment

In recent years, the area of the semiconductor element area has been expanded in order to increase the amount of current to flow, and thus the distance between the source electrode 42 and the pad 44 has been getting smaller. That is, the peeling occurred on the source electrode 42 side is likely to easily reach the pad 44. As shown in FIG. 12, in the configuration having a triple point TP at which the encapsulating body 30, the source electrode 42 (upper layer 42*b*), and the joining material 91 meet together, thermal stress tends to concentrate on the triple point TP. For example, the peeling of the encapsulating body 30 occurs from the triple point TP at a starting point, and progresses toward the pad 44. If the peeling reaches the pad 44, there is a possibility that a crack may occur in the connection portion (joining portion) between the bonding wire 90 and the pad 44, or the bonding wire 90 may be broken. That is, the connection reliability is degraded at the connection portion between the bonding wire 90 and the pad 44.

Further, if the peeling progresses from the crack generated in the connection portion between the bonding wire 90 and the pad 44 due to the thermal stress and reaches the source electrode 42, the thermal stress tends to concentrate on the joining material 91 and the source electrode 42. That is, the connection reliability is degraded at the connection portion of the source electrode 42.

In the present embodiment, the protective film portion 45*a* has the protruded portion 455 and the recessed portion 456. A wall surface defining the protruded portion 455 has a component orthogonal to the progressing direction of peeling of the encapsulating body 30 with respect to the upper surface of the protective film 45. As a result, it is less likely that the peeling of the encapsulating body 30 will progress between the portion closer to the source electrode 42 than the protruded portion 455 and the portion closer to the pad 44 than the protruded portion 455. Similarly, the wall surface defining the recessed portion 456 has a component orthogonal to the progressing direction of peeling of the encapsulating body 30 with respect to the upper surface of the protective film 45. As a result, it is less likely that the peeling of the encapsulating body 30 will progress between the portion closer to the source electrode 42 than the recessed portion 456 and the portion closer to the pad 44 than the recessed portion 456. As a result, it is possible to suppress the progress of peeling of the encapsulating body 30 between the source electrode 42 and the pad 44. Therefore, in combination with the effects of the embodiments described above, it is possible to more effectively suppress the degradation in connection reliability.

Further, since the protective film 45 is formed with the protruded portion 455 and the recessed portion 456, the contact area between the encapsulating body 30 and the protective film 45 is increased, and an anchor effect can be expected. That is, the adhesion of the sealing body 30 to the protective film 45 can be improved. This can also suppress the peeling from progressing.

<Modifications>

An example in which the protective film portion 45*a* has the protruded portion 455 and the recessed portion 456 has been described. However, the present disclosure is not limited to such an example. The protective film portion 45*a* may have only the protruded portion 455, or may have only the recessed portion 456. The protective film portion 45*a* may have the recessed portion 456 on a side adjacent to the source electrode 42, and the protruded portion 455 on a side adjacent to the pad 44.

Figure 13:
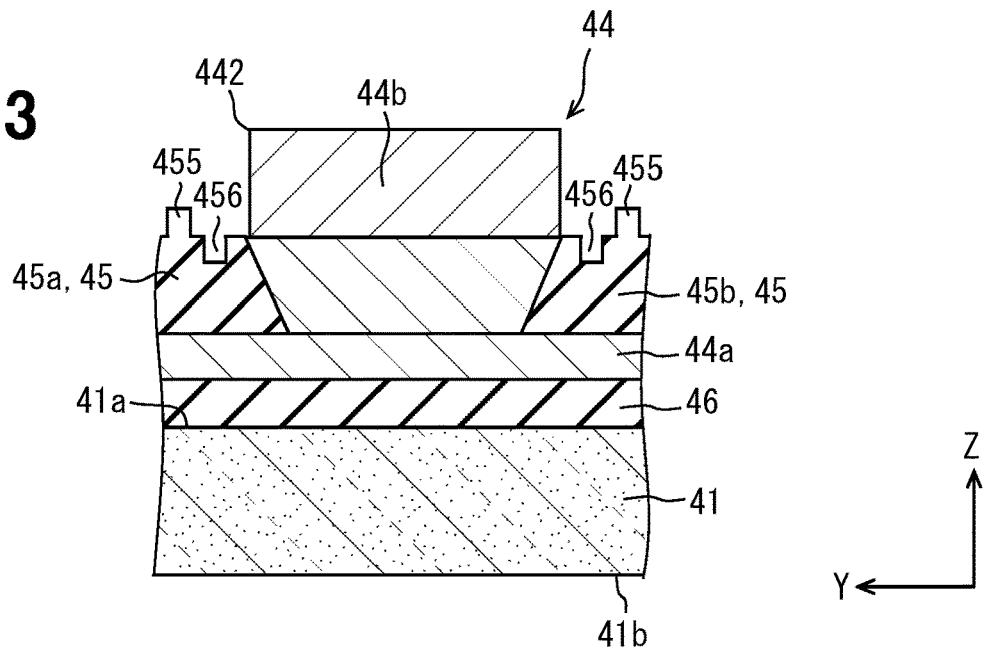
FIG. 13 is a cross-sectional view of a part of a semiconductor element as a modification.

An example in which the protective film portion 45*a* has the protruded portion 455 and/or the recessed portion 456 has been described. However, the present disclosure is not limited to such an example. The protruded portion 455 and/or the recessed portion 456 may be provided in a portion other than the protective film portion 45*a* on a periphery of the pad 44. For example, as shown in FIG. 13, the protruded portions 455 and the recessed portions 456 may be provided on both sides of the pad 44 in the Y direction. FIG. 13 is a cross sectional view corresponding to FIG. 5.

The protruded portion 455 and the recessed portion 456 are formed not only in the protective film portion 45*a* between the source electrode 42 and the pad 44, but also in a protective film portion 45*b* between the pad 44 and the end portion of the semiconductor element 40. In such a configuration, in addition to the effects described above, it is possible to suppress the peeling, which begins due to the crack occurred at the connection portion between the bonding wire 90 and the pad 44, from reaching the end portion of the semiconductor element 40. Thus, it is possible to suppress the degradation of the insulation reliability. In FIG. 13, each of the protective film portion 45*a* and the protective film portion 45*b* have the protruded portion 455 and the recessed portion 456. However, it goes without saying that the protective film portion 45*a* and the protective film portion 45*b* may have only one of the protruded portion 455 and the recessed portion 456.

The configurations of the present embodiment can be combined with any of the configuration of the first embodiment, the configuration of the second embodiment, and the configurations of the various modifications. For example, in FIG. 12, the example in which the pad 44 has the protruded portion 442 is shown. However, the present embodiment can be combined with a configuration in which the pad 44 has the recessed portion 443.

Fourth Embodiment

The present embodiment is a modification of the preceding embodiments described above as a basic configuration and may incorporate description of the preceding embodiments. In the embodiments described above, the boundary between the solder and the protective film, that is, the open end of the protective film is provided at a position overlapping the active region. Alternatively, the open end of the protective film may be provided outside the active region.

Figure 14:
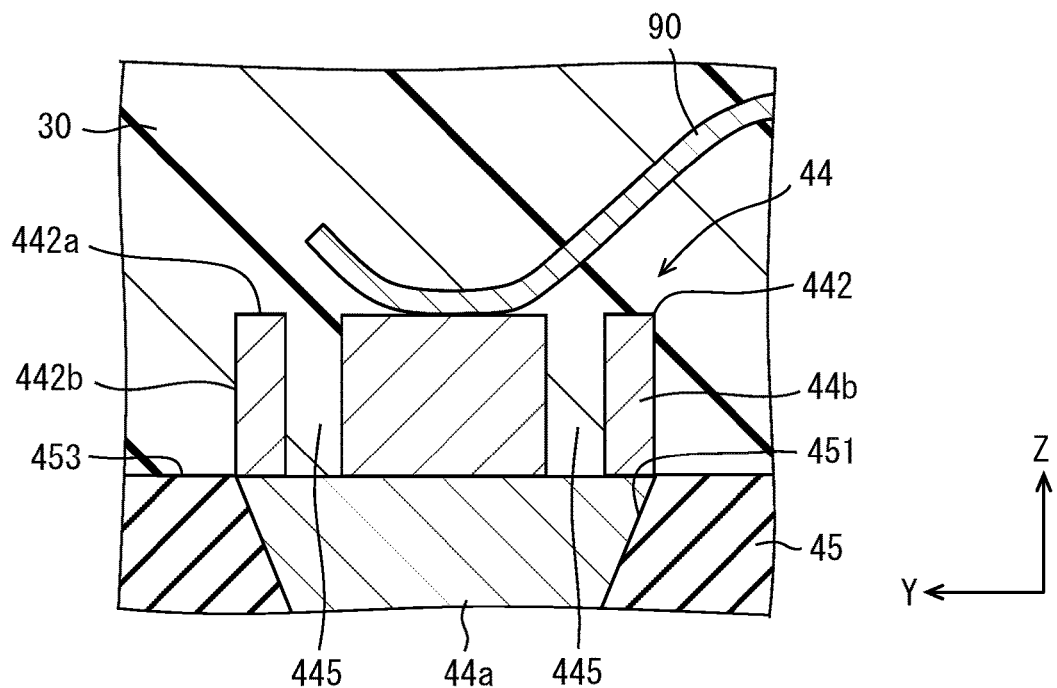
FIG. 14 is a cross-sectional view of a part of a semiconductor device according to a fourth embodiment, the part including a pad of a semiconductor element and a periphery thereof.
Figure 15:
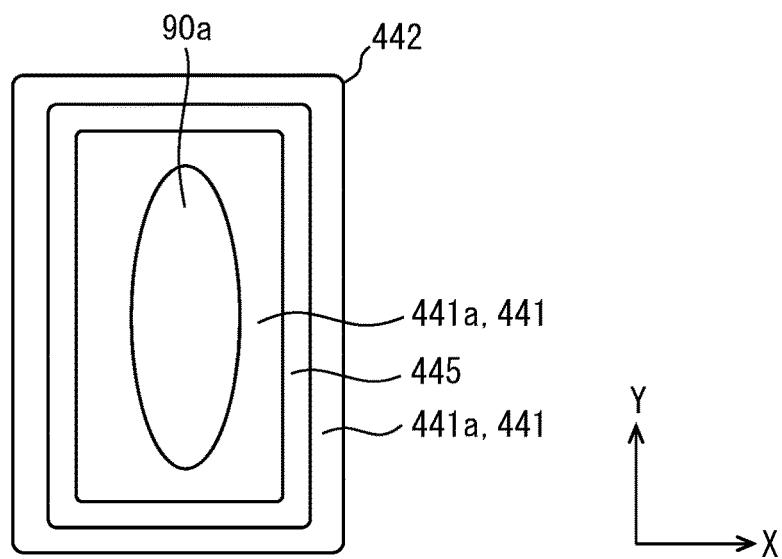
FIG. 15 is a plan view of the pad of the semiconductor element.

FIG. 14 is a cross-sectional view showing the periphery of the pad 44 of the semiconductor element 40 in the semiconductor device 20 according to the present embodiment. FIG. 14 is a cross-sectional view corresponding to FIG. 6. However, in FIG. 14, the encapsulating body 30 and the pad 44 are also hatched. FIG. 15 is a plan view showing the pad 44.

The pad 44 has a protruded portion 442 having a similar configuration to the pad of the first embodiment described above with reference to FIG. 5. As shown in FIGS. 14 and 15, the pad 44 has a groove 445 that penetrates the upper layer 44*b* and has a bottom at the base layer 44*a*. The groove 445 has an annular shape in a plan view so as to surround the joining portion 90*a* of the pad 44 with the bonding wire 90. Other configurations of the present embodiment are the same as those of the semiconductor device 20 of the preceding embodiments.

Summary of Fourth Embodiment

In the present embodiment, the pad 44 has the groove 445 penetrating the upper layer 44*b*. The wall surface defining the groove 445 has a component orthogonal to the progressing direction of the peeling of the encapsulating body 30 with respect to the upper surface 442*a* of the protruded portion 442. As a result, it is less likely that the peeling of the encapsulating body 30 will progress. Therefore, in combination with the effects of the embodiments described above, the reliability of the semiconductor device 20 can be further enhanced.

Further, since the pad 44 is formed with the groove 445, the contact area between the encapsulating body 30 and the pad 44 is increased, and the anchor effect can be expected. That is, the adhesion of the encapsulating body 30 to the pad 44 can be improved. This can also suppress the progress of the peeling.
<Modifications>

The pad 44 may have a plurality of grooves 445 in layers. Further, a part of the plurality of grooves 445 may be arranged directly below the bonding portion of the pad 44 with the bonding wire 90 in a plan view.

The configuration of the present embodiment can be combined with any of the configuration of the first embodiment, the configuration of the second embodiment, the configuration of the third embodiment, and the configurations of the various modifications. For example, in the configuration having the recessed portion 443, the groove 445 may be formed in the upper layer 44*b*.

Other Embodiments

The present disclosure in this specification, the drawings, and the like is not limited to the embodiments and modifications exemplified as above. The disclosure encompasses the embodiments and modifications exemplified above and various modifications made by those skilled in the art based thereon. For example, the present disclosure is not limited to the combinations of components and/or elements shown in the embodiments. The present disclosure may be implemented in various combinations of embodiments and modifications. The present disclosure may have additional parts that can be added to the embodiments or modifications. The present disclosure encompasses omissions of parts and/or elements from the embodiments and modifications. The present disclosure encompasses replacement or combination of parts and/or elements between one embodiment and another. The disclosed technical scope is not limited to the description of the embodiments. It should be understood that some disclosed technical ranges are indicated by description of claims, and includes every modification within the equivalent meaning and the scope of description of claims.

The disclosure in the specification, the drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above" or "connected", the element or the layer may be directly disposed above or connected to another element or another layer, or an intervening element or an intervening layer may be present therebetween. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in another direction (rotated 90 degrees or in any other direction) and the spatially relative terms used herein are interpreted accordingly.

The vehicle drive system 1 is not limited to the above configuration. Although an example including one motor generator 3 has been described, the vehicle drive system 1 to which the present disclosure is employed is not limited to such an example. The vehicle drive system 1 may include a plurality of motor generators. An example in which the power conversion device 4 includes the inverter 6 as a power conversion unit has been described. However, the present disclosure is not limited to such an example. The power conversion device 4 may have a plurality of inverters, for example. The power conversion device 4 may have at least one inverter and at least one converter. The power conversion device 4 may have only the converter.

An example in which the semiconductor element 40 has the MOSFET 11 as a switching element has been described. However, the present invention is not limited to such an example. For example, the semiconductor element 40 may have an insulated gate bipolar transistor (IGBT) as the switching element.

The configuration in which the back surfaces 50*b* and 60*b* of the heat sinks 50 and 60 are exposed from the encapsulating body 30 have been exemplified. However, the present disclosure is not limited to such a configuration. At least one of the back surfaces 50*b* and 60*b* may be covered with the encapsulating body 30. At least one of the back surfaces 50*b* and 60*b* may be covered with an insulating member (not shown) different from the encapsulating body 30.

The configuration in which the heat sink 50 and the electrically conductive spacer 70 are provided as the first wiring member connected to the source electrode 42 (first main electrode), and the heat sink 60 is provided as the second wiring member connected to the drain electrode 43 (second main electrode) has been exemplified. However, the configurations of the wiring members are not limited to the examples described above. For example, instead of the heat sinks 50 and 60, a substrate in which a metal body is arranged on both sides of an insulating base material may be adopted. An example of the substrate is a direct bonded copper (DBC) substrate. Instead of the electrically conductive spacer 70, the heat sink 50 may be provided with a protruded portion. Similarly, a metal body on the inner surface side of the substrate may be provided with a protruded portion.

As the semiconductor device 20, the semiconductor device of the double-sided heat dissipation structure has been exemplified. However, the semiconductor device 20 of the present disclosure is not limited to the double-sided heat dissipation structure. The present disclosure can be applied to a semiconductor device of a single-sided heat dissipation structure. For example, the drain electrode 43 may be connected to a heat sink or a metal body of a substrate, and the source electrode 42 may be connected to a lead.

The semiconductor device 20 having one semiconductor element 40 constituting one arm has been exemplified. However, the semiconductor device of the present disclosure is not limited to such a configuration. The semiconductor device 20 may include a plurality of semiconductor elements 40 constituting one arm. That is, a plurality of semiconductor elements 40 may be connected in parallel to each other so as to form one arm. Further, the semiconductor device 20 may include a plurality of semiconductor elements 40 constituting the upper and lower arm circuit 9 for one phase. The semiconductor device 20 may include a plurality of semiconductor elements 40 constituting the upper and lower arm circuits 9 for plural phases.

What is claimed is:

1. A semiconductor device comprising:
    a semiconductor element including:
        a semiconductor substrate;
        a first main electrode disposed on a first surface of the semiconductor substrate,
        a second main electrode disposed on a second surface of the semiconductor substrate opposite to the first surface in a thickness direction of the semiconductor substrate; and
        a pad, as a signal electrode, disposed on the first surface at a position different from the first main electrode;
    a first wiring member electrically connected to the first main electrode;
    a second wiring member electrically connected to the second main electrode;
    a bonding wire connected to the pad; and
    an encapsulating body encapsulating at least a part of the first wiring member, at least a part of the second wiring member, the semiconductor element, and the bonding wire, wherein
    the semiconductor element includes a protective film disposed on the first surface of the semiconductor substrate,
    the protective film is formed with an opening,
    the pad has a bottom surface, a side surface, and an upper surface connecting from the side surface, as wall surfaces defining a pad recessed portion, the pad recessed portion is disposed in and exposed from the opening of the protective film, the upper surface of the pad recessed portion being at a same level as an upper end of the opening of the protective film and connecting to the upper end of the opening of the protective film, and
    the bottom surface of the pad recessed portion provides a connection area to which the bonding wire is connected,
    the side surface and the upper surface of the pad recessed portion provide a peripheral area on a periphery of the connection area, and
    the side surface of the pad recessed portion defines an angle of 90 degrees or less relative to the bottom surface of the pad recessed portion.

2. The semiconductor device according to claim 1, wherein
    the upper surface of the pad recessed portion defines an angle of 90 degrees or less relative to the side surface of the pad recessed portion.

3. A semiconductor device comprising:
    a semiconductor element including:
        a semiconductor substrate;
        a first main electrode disposed on a first surface of the semiconductor substrate,
        a second main electrode disposed on a second surface of the semiconductor substrate opposite to the first surface in a thickness direction of the semiconductor substrate; and
        a pad, as a signal electrode, disposed on the first surface at a position different from the first main electrode;
    a first wiring member electrically connected to the first main electrode through a joining material;
    a second wiring member electrically connected to the second main electrode;
    a bonding wire connected to the pad; and
    an encapsulating body encapsulating at least a part of the first wiring member, at least a part of the second wiring member, the semiconductor element, and the bonding wire, wherein
    the semiconductor element includes a protective film disposed on the first surface of the semiconductor substrate,
    the protective film is formed with a first opening and a second opening,
    the pad has an exposed surface exposed from the first opening of the protective film,
    the exposed surface includes a connection area to which the bonding wire is connected, and a peripheral area on a periphery of the connection area, and
    the peripheral area has a surface that defines an angle of 90 degrees or less relative to a surface of the connection area,
    the first main electrode has an exposed portion that is exposed from the second opening of the protective film,
    the exposed portion of the first main electrode, the joining material and the encapsulating body meet together to form a triple point, and
    the protective film includes at least one of a film protruded portion and a film recessed portion between the triple point and the pad in a planar direction of the semiconductor substrate.

4. The semiconductor device according to claim 3, wherein
    the pad has a pad protruded portion that protrudes from a peripheral edge of the first opening of the protective film, the pad protruded portion having an upper surface and a side surface, and the upper surface of the pad protruded portion provides the connection area, and the side surface of the pad protruded portion provides the peripheral area.

5. The semiconductor device according to claim 4, wherein a predetermined range of the side surface from a lower end of the pad protruded portion defines an angle of 90 degrees or less relative to the peripheral edge of the first opening of the protective film.

6. The semiconductor device according to claim 3, wherein the pad has a pad recessed portion disposed in and exposed from the first opening of the protective film, the pad includes a bottom surface, a side surface and an upper surface connecting from the side surface as walls defining the pad recessed portion, the upper surface of the pad recessed portion is at a same level as an upper end of the first opening and connects to the upper end of the first opening, the bottom surface of the pad recessed portion provides the surface of the connection area, and the side surface of the pad recessed portion provides the surface of the peripheral area.

7. The semiconductor device according to claim 3, wherein the pad includes a base layer, and an upper layer that is disposed on the base layer and provides at least a part of the exposed surface, the upper layer of the pad is formed with a groove penetrating the upper layer, the groove has a loop shape surrounding a part of the upper layer including the connection area, an upper surface of the part of the upper layer surrounded by the groove provides the surface of the connection area, and a side surface of the part of the upper layer defining the groove provides the surface of the peripheral area.

8. A semiconductor device comprising:

a semiconductor element including:
 a semiconductor substrate;
 a first main electrode disposed on a first surface of the semiconductor substrate,
 a second main electrode disposed on a second surface of the semiconductor substrate opposite to the first surface in a thickness direction of the semiconductor substrate; and
 a pad, as a signal electrode, disposed on the first surface at a position different from the first main electrode;

a first wiring member electrically connected to the first main electrode;

a second wiring member electrically connected to the second main electrode;

a bonding wire connected to the pad; and an encapsulating body encapsulating at least a part of the first wiring member, at least a part of the second wiring member, the semiconductor element, and the bonding wire, wherein the semiconductor element includes a protective film disposed on the first surface of the semiconductor substrate, the protective film is formed with an opening, the pad has an exposed surface exposed from the opening of the protective film to be encapsulated by the encapsulating body, the exposed surface includes a connection area to which the bonding wire is connected, and a peripheral area on a periphery of the connection area, the peripheral area has a surface that defines an angle of 90 degrees or less relative to a surface of the connection area, the pad includes a base layer, and an upper layer that is disposed on the base layer and provides at least a part of the exposed surface, the upper layer of the pad is formed with a groove penetrating the upper layer and the groove is filled with the encapsulating body, the groove has a loop shape surrounding a part of the upper layer including the connection area, an upper surface of the part of the upper layer surrounded by the groove provides the surface of the connection area, and a side surface of the part of the upper layer defining the groove provides the surface of the peripheral area.

9. The semiconductor device according to claim 8, wherein the upper layer of the pad is protruded from a peripheral edge of the opening of the protective film as a pad protruded portion.

10. The semiconductor device according to claim 9, wherein a predetermined range of a side surface of the pad protruded portion from a lower end of the pad protruded portion defines an angle of 90 degrees or less relative to the peripheral edge of the opening of the protective film.

* * * * *